(12) United States Patent
Son et al.

(10) Patent No.: US 10,720,583 B2
(45) Date of Patent: Jul. 21, 2020

(54) ORGANIC SOLAR CELLS WITH INCREASED PHOTOSTABILITY

(71) Applicant: KOREA INSTITUTE OF SCIENCE AND TECHNOLOGY, Seoul (KR)

(72) Inventors: Hae Jung Son, Seoul (KR); Phillip Lee, Seoul (KR); Jai Kyeong Kim, Seoul (KR); Sungmin Park, Seoul (KR); Injeong Shin, Seoul (KR); Hyojung Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 245 days.

(21) Appl. No.: 15/665,923

(22) Filed: Aug. 1, 2017

(65) Prior Publication Data
US 2018/0269396 A1 Sep. 20, 2018

(30) Foreign Application Priority Data
Mar. 15, 2017 (KR) .................. 10-2017-0032221

(51) Int. Cl.
*H01L 51/00* (2006.01)
*H01L 27/30* (2006.01)
(Continued)

(52) U.S. Cl.
CPC ........ *H01L 51/0032* (2013.01); *H01L 27/301* (2013.01); *H01L 51/005* (2013.01);
(Continued)

(58) Field of Classification Search
CPC ............... H01L 51/005; H01L 51/0032; H01L 51/0047; H01G 9/20
See application file for complete search history.

(56) References Cited

U.S. PATENT DOCUMENTS

2015/0144195 A1* 5/2015 Irwin ................... H01G 9/2027
136/260

FOREIGN PATENT DOCUMENTS

| JP | 2015-191964 A | 11/2015 |
| KR | 10-1132821 B1 | 4/2012 |
| KR | 10-2016-0033392 A | 3/2016 |

OTHER PUBLICATIONS

Nakashima et al. "Interface Modification on TiO2 Electrode Using Dendrimers in Dye-Sensitized Solar Cells". Chem. Mater. 2008, 20, 2538-2543. (Year: 2008).*

* cited by examiner

*Primary Examiner* — Lindsey A Bernier
(74) *Attorney, Agent, or Firm* — Rabin & Berdo, P.C.

(57) ABSTRACT

An organic solar cell includes a substrate; a first electrode; a second electrode disposed opposite the first electrode; a photoactive layer that is disposed between the first electrode and the second electrode, and that comprises n-type organic semiconductor material and p-type organic semiconductor material; and an intermediate layer that is disposed on at least one surface of the photoactive layer and that contains a compound represented by Formula 1 below:

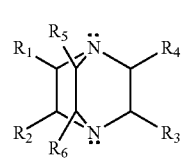

(1)

where $R_1$, $R_2$, $R_3$, $R_4$, $R_5$, and $R_6$ are each independently selected from the group consisting of hydrogen atoms, a carbonyl group, a hydroxyl group, a nitro group, an
(Continued)

amino group, a sulfonyl group, a phosphoryl group, straight-chain or branched $C_1$-$C_7$ alkyl groups, and straight-chain or branched $C_8$-$C_{20}$ alkyl groups, wherein $R_1$, $R_2$, $R_3$, $R_4$, $R_5$, and $R_6$ are not all the same. The organic solar cells have enhanced photostability due to introduction of the intermediate layer.

6 Claims, 15 Drawing Sheets

(51) Int. Cl.
*H01L 51/42* (2006.01)
*H01G 9/20* (2006.01)

(52) U.S. Cl.
CPC ........... *H01L 51/4253* (2013.01); *H01G 9/20* (2013.01); *H01L 51/0003* (2013.01); *H01L 51/0036* (2013.01); *H01L 51/0047* (2013.01); *H01L 51/42* (2013.01); *Y02E 10/549* (2013.01)

ORGANIC SOLAR CELLS WITH INCREASED PHOTOSTABILITY

CROSS-REFERENCE TO RELATED APPLICATIONS

This application claims priority under 35 U.S.C. § 119 to Korean Patent Application No. 10-2017-0032221 filed on Mar. 15, 2017 in the Korean Intellectual Property Office, the disclosure of which is incorporated herein by reference in its entirety.

BACKGROUND OF THE INVENTION

1. Field of the Invention

The present invention relates to organic solar cells with increased photostability, and more specifically to organic solar cells whose photostability is enhanced by the introduction of an intermediate layer.

2. Description of the Related Art

Solar cells are photovoltaic cells that convert inexhaustible solar energy into electrical energy. Solar cells are environmentally friendly next-generation energy sources and are currently being investigated in attempts to develop alternative energy. Solar cells can be broadly classified into two types by the kind of material they use: solar cells using inorganic materials, such as silicon, and solar cells using organic materials. Of these, solar cells using inorganic compound semiconductors, such as silicon and gallium arsenide (GaAs), have many advantages but are very expensive for their performance, which limits their commercial applications.

Organic solar cells have been proposed as alternatives to inorganic solar cells. Organic solar cells include a photoactive layer using p-type and n-type organic semiconductor materials. Organic solar cells are simple to fabricate and easy to modulize due to their simple structure. Organic solar cells have the advantage of less energy loss between unit elements and modules. Organic solar cells have the ability to absorb at least 50% of incident light even at small thicknesses due to their high light absorption coefficient. Ultimately, organic solar cells can be fabricated based on solution processing, resulting in a considerable cost reduction compared to inorganic solar cells. Moreover, organic solar cells were reported to achieve photoelectric conversion efficiencies of 10% or higher.

Despite these advantages, organic solar cells suffer from poor long-term stability and short lifetime because of their poor photostability. Poor long-term stability and short lifetime are the greatest obstacles to the commercialization of organic solar cells.

In order to solve the problems associated with long-term stability of organic solar cells, considerable research efforts have been made in developing light-absorbing materials, intermediate layers for charge transport, and electrode materials. However, there have been no reports on materials for improving the photostability of organic solar cells. There is thus a need to develop materials that can improve the photostability of organic solar cells.

PRIOR ART DOCUMENTS

Patent Documents

Patent Document 1: Korean Patent No. 10-1132821

SUMMARY OF THE INVENTION

The present invention has been made in view of the above problems, and it is one object of the present invention to provide organic solar cells with improved life characteristics that can maintain their initial efficiency for a long time. It is a further object of the present invention to provide methods for fabricating the organic solar cells.

One aspect of the present invention provides an organic solar cell including a substrate, a first electrode and a second electrode opposite each other, and a photoactive layer disposed between the first and second electrodes wherein the photoactive layer includes n-type and p-type organic semiconductor materials and a compound represented by Formula 1:

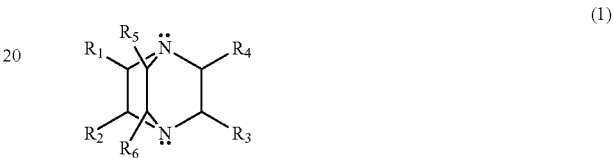

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups.

In Formula 1, $R_1$ may be the same as $R_2$, $R_3$ may be the same as $R_4$, and $R_5$ may be the same as $R_6$.

In Formula 1, $R_1$, $R_2$, $R_3$, $R_4$, $R_5$, and $R_6$ may be all hydrogen atoms or the same straight-chain $C_1$-$C_7$ alkyl group.

In Formula 1, $R_1$, $R_2$, $R_3$, $R_4$, $R_5$, and $R_6$ may be all hydrogen atoms.

The compound represented by Formula 1 may be present in an amount of 0.1 to 50 parts by weight, preferably 1 to 35 parts by weight, based on 100 parts by weight of the organic semiconductor materials.

The photoactive layer may have an average thickness of 1 to 500 nm.

The photoactive layer may further include 1,8-diiodooctane.

The organic solar cell may further include either a hole transport layer or an electron transport layer or both.

A further aspect of the present invention provides a method for fabricating an organic solar cell including a substrate, a first electrode and a second electrode opposite each other, and a photoactive layer disposed between the first and second electrodes, the method including I) depositing the first electrode on the substrate, II) coating a solution of n-type and p-type organic semiconductor materials, the compound represented by Formula 1, and a first solvent on the first electrode to form the photoactive layer, and III) drying the photoactive layer and depositing the second electrode thereon.

Another aspect of the present invention provides an organic solar cell including a substrate, a first electrode and a second electrode opposite each other, a photoactive layer disposed between the first and second electrodes, and an intermediate layer disposed on at least one surface of the photoactive layer wherein the intermediate layer contains a compound represented by Formula 1:

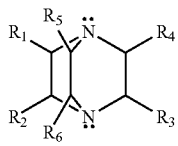

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups.

In Formula 1, $R_1$ may be the same as $R_2$, $R_3$ may be the same as $R_4$, and $R_5$ may be the same as $R_6$.

In Formula 1, $R_1$, $R_2$, $R_3$, $R_4$, $R_5$, and $R_6$ may be all hydrogen atoms or the same straight-chain $C_1$-$C_7$ alkyl group.

In Formula 1, $R_1$, $R_2$, $R_3$, $R_4$, $R_5$, and $R_6$ may be all hydrogen atoms.

The intermediate layer may have a thickness of 1 to 20 nm.

The photoactive layer may further include 1,8-diiodooctane.

The organic solar cell may further include either a hole transport layer or an electron transport layer or both.

Yet another aspect of the present invention provides a method for fabricating the organic solar cell including a substrate, a first electrode and a second electrode opposite each other, a photoactive layer disposed between the first and second electrodes, and an intermediate layer disposed on at least one surface of the photoactive layer, the method including I) depositing the first electrode on the substrate, II) coating a solution of n-type and p-type organic semiconductor materials and a first solvent on the first electrode to form the photoactive layer, III) drying the photoactive layer and depositing the second electrode thereon, and IV) coating a solution including a compound represented by Formula 1:

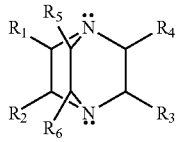

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups, and a second solvent on the first electrode after step I) and before step II) and/or on the photoactive layer after step II) and before step III) to form the intermediate layer.

The solution used in step IV) may include 1 to 10% by weight of the compound represented by Formula 1 with the balance being the second solvent.

The organic solar cells of the present invention are free from problems associated with poor photostability of conventional organic solar cells. Therefore, the organic solar cells of the present invention can maintain their initial efficiency for a long time, achieving markedly improved life characteristics. In addition, the organic solar cells of the present invention can be fabricated on a large scale.

The compound of Formula 1 can effectively protect the light-absorbing materials susceptible to singlet oxygen to maintain excellent characteristics of the organic solar cells according to the present invention for a long time.

In other words, the singlet oxygen quencher is located adjacent to the absorber layer including the light-absorbing materials to effectively quench singlet oxygen capable of reacting with the light-absorbing materials so that excellent characteristics of the organic solar cells according to the present invention can be maintained for a long time.

The organic solar cells of the present invention are structurally modified such that their life characteristics are improved. Nevertheless, the organic solar cells of the present invention can be fabricated in a simple manner on a large scale.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
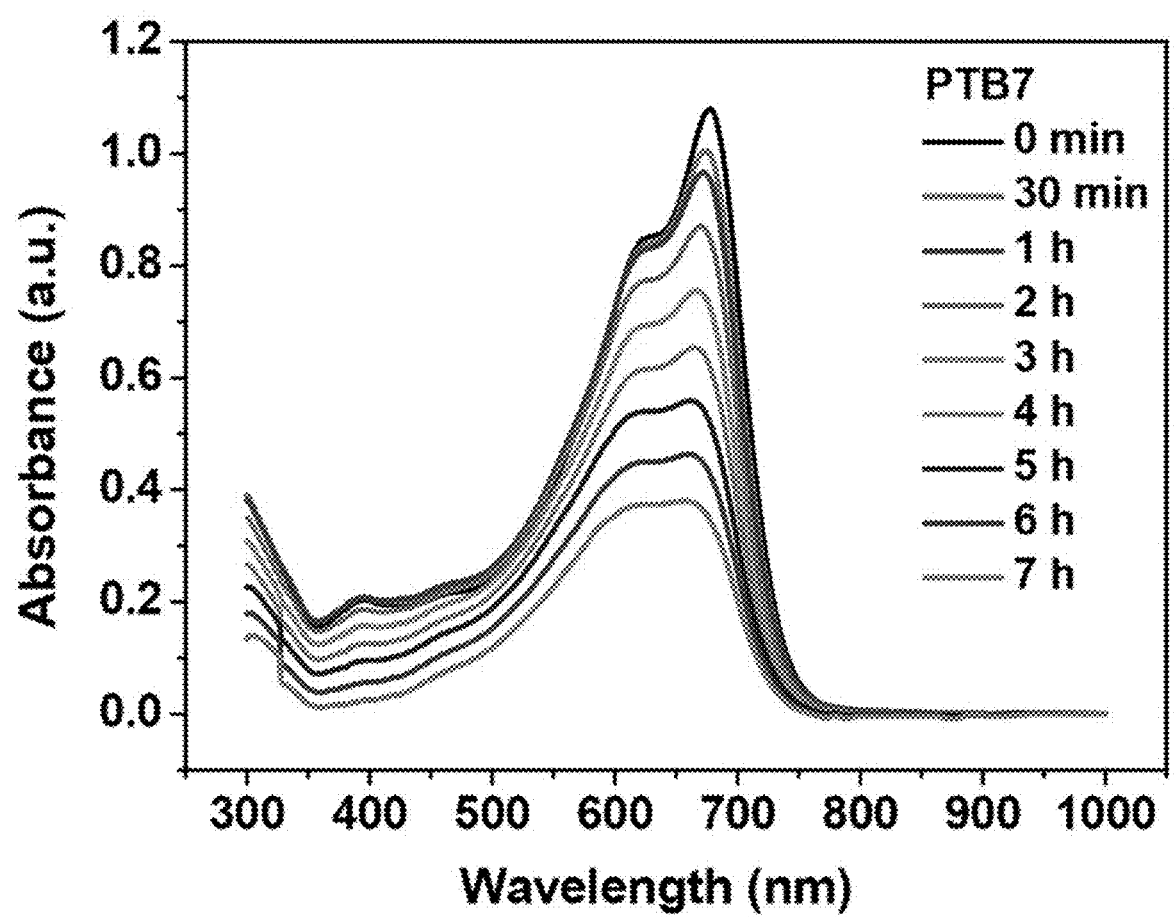
FIG. 1 shows absorption spectra of a PTB7 solution prepared in Preparative Example 1 as a function of exposure time, which were measured in Experimental Example 1.

Several aspects and various embodiments of the present invention will now be described in more detail.

Much research has been conducted to find factors that negatively affect the lifetime of organic solar cells. Among these factors, the present inventors have found that decomposition of organic semiconductor materials for photoactive layers causes a reduction in the lifetime of organic solar cells.

Many factors other than decomposition of organic semiconductor materials are known to reduce the lifetime of organic solar cells. Particularly, the present inventors were aware that singlet oxygen produced by energy transferred from triplet states of organic semiconductor materials has the greatest influence on the lifetime of organic solar cells. Based on this awareness, the present inventors have made efforts to provide a solution to the above problems and finally arrived at the present invention.

As a result of research to find a solution to the problem of conventional organic solar cells associated with the decomposition of organic semiconductor materials (particularly, p-type organic semiconductor materials) for photoactive layers by singlet oxygen, the present inventors have succeeded in developing singlet oxygen quenchers that are mixed with organic semiconductor materials for photoactive layers to effectively quench singlet oxygen. Hereinafter, a detailed description will be given of the singlet oxygen quenchers.

Therefore, one aspect of the present invention relates to an organic solar cell including a substrate, a first electrode and a second electrode opposite each other, and a photoactive layer disposed between the first and second electrodes wherein the photoactive layer includes n-type and p-type organic semiconductor materials and a compound represented by Formula 1:

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups.

According to one embodiment, in Formula 1, $R_1$ may be the same as $R_2$, $R_3$ may be the same as $R_4$, and $R_5$ may be the same as $R_6$. This structure is advantageous in terms of ease of synthesis over other structures wherein $R_1$ is different from $R_2$, $R_3$ is different from $R_4$, and $R_5$ is different from $R_6$, and allows the organic solar cell to undergo less deterioration in photoelectric conversion efficiency.

According to a further embodiment, in Formula 1, $R_1$, $R_2$, $R_3$, $R_4$, $R_5$, and $R_6$ may be all hydrogen atoms or the same straight-chain $C_1$-$C_7$ alkyl group. This structure is highly soluble compared to other structures wherein one or more of $R_1$, $R_2$, $R_3$, $R_4$, $R_5$, and $R_6$ are not hydrogen atoms or are functional groups other than the straight-chain $C_1$-$C_7$ alkyl group, and as a result, it is homogenized with the organic semiconductor materials to form the photoactive layer in the form of a thin film, causing no significant loss in initial efficiency and no significant time-dependent changes in photoelectric conversion efficiency.

According to another embodiment, in Formula 1, $R_1$, $R_2$, $R_3$, $R_4$, $R_5$, and $R_6$ may be all hydrogen atoms. Specifically, this structure is represented by Formula 2:

(2)

It was found that the use of an antioxidant or triplet quencher other than the compound represented by Formula 2 fails to improve and even deteriorates the photostability of the organic semiconductor materials. In contrast, the use of the compound represented by Formula 2 is effective in improving the photostability of the organic solar cell while maintaining the efficiency of the organic solar cell at a level equal or similar to its initial efficiency.

The compound represented by Formula 1 is present in an amount ranging from 0.1 to 100 parts by weight, based on 100 parts by weight of the organic semiconductor materials. Within this range, improved photostability of the photoactive layer can be achieved. Preferably, the compound represented by Formula 1 is present in an amount of 1 to 35 parts by weight, based on 100 parts by weight of the organic semiconductor materials. If the content of the compound represented by Formula 1 is less than 1 part by weight, based on 100 parts by weight of the organic semiconductor materials, sufficient photostability is not expected. Meanwhile, if the content of the compound represented by Formula 1 exceeds 35 parts by weight, based on 100 parts by weight of the organic semiconductor materials, the number of charge transfer pathways in the photoactive layer is limited or the morphology of the photoactive layer is affected, causing low short-circuit current density ($J_{SC}$) and fill factor (FF) of the organic solar cell. As a result, the efficiency of the organic solar cell drops to half of its initial value.

The average thickness of the photoactive layer is not particularly limited but is preferably between 1 and 500 μm.

The photoactive layer may further include 1,8-diiodooctane to enhance the photostability of the organic solar cell.

Figure 14A:
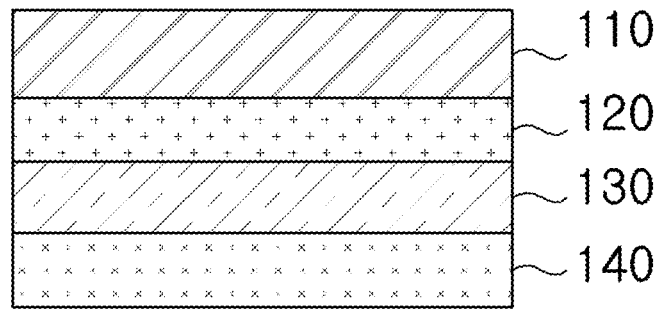
FIGS. 14A and 14B schematically illustrate exemplary structures of an organic solar cell according to one embodiment of the present invention.
Figure 14B:
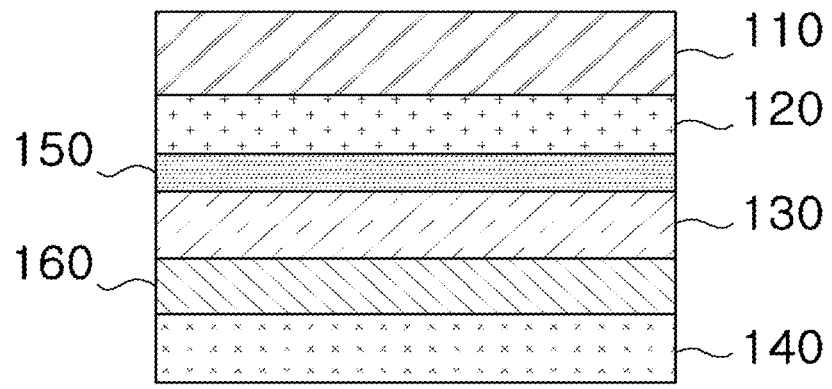

The organic solar cell may further include either a hole transport layer or an electron transport layer or both. Exemplary structures of the organic solar cell are illustrated in FIGS. 14A and 14B.

Suitable structures and materials known in the art may be employed in the organic solar cell of the present invention. Specifically, the substrate may be, for example, a glass, flexible polymer or flexible metal substrate. The first electrode may have a multilayer structure including the substrate. Preferably, the first electrode is a transparent electrode with a transparent substrate. Suitable transparent electrodes and transparent substrates known in the art may be used without particular limitation in the present invention. Preferably, the transparent electrode is indium doped tin oxide (ITO) or fluorine dopedd tin oxide (FTO). The transparent substrate is preferably a glass substrate.

The electron transport layer provides pathways through which electrons can flow smoothly and may include a metal oxide or ionic polymer.

The metal oxide may be any of those known in the art but is preferably selected from the group consisting of Zn oxides, Ti oxides, Mo oxides, Al oxides, composites thereof, and mixtures thereof.

The ionic polymer may be any of those known in the art and may be, for example, selected from the group consisting of polyethyleneimine (PEI), polyethyleneimine ethoxylate (PEIE), and a mixture thereof.

The electron transport layer may be between 1 and 60 nm in thickness. If the thickness of the electron transport layer exceeds 60 nm, the travel distance of photocurrent is long, resulting in poor efficiency.

The p-type organic semiconductor material and the n-type organic semiconductor material are not particularly limited and may be those known in the art. The p-type organic semiconductor material may be selected from the group consisting of P3HT, PCDTBT, PCTDTBT, MEH-PPV, PTB7, PBDTTT-CF, PFN, and mixtures thereof. The n-type organic semiconductor material may be selected from the group consisting of PCBM, ICBA, and a mixture thereof.

It is preferred that the electron transport layer has the ability to block holes from migrating to the first electrode.

The hole transport layer provides pathways through which holes can flow smoothly and may include a metal oxide or p-type organic semiconductor compound.

The metal oxide may be any of those known in the art but is preferably selected from the group consisting of Mo oxides, V oxides, Zn oxides, Al oxides, Ti oxides, composites thereof, and mixtures thereof.

The p-type organic semiconductor compound may be any of those known in the art and may be, for example, polyethylenedioxythiophene (PEDOT).

The second electrode formed on the hole transport layer may be any of those known in the art but is preferably selected from the group consisting of gold, silver, platinum, palladium, copper, aluminum, and composites thereof. The work function of the second electrode may be appropriately determined by the energy level of the hole transport layer.

Due to its improved structure, the organic solar cell of the present invention maintains 50 to 80% of its initial photoelectric conversion efficiency when exposed to simulated sunlight (AM 1.5G, 100 mW/cm²) for 15 to 25 hours without the need for encapsulation. In contrast, a conventional organic solar cell device without a stabilizing intermediate layer maintains only 30 to 45% of its initial photoelectric conversion efficiency when exposed to simulated sunlight (AM 1.5G, 100 mW/cm²) for 15 to 25 hours. That is, the photoelectric conversion efficiency of the organic solar cell according to the present invention is maintained at a higher level than that of the conventional organic solar cell.

A further aspect of the present invention relates to a method for fabricating an organic solar cell including a substrate, a first electrode and a second electrode opposite each other, and a photoactive layer disposed between the first and second electrodes, the method including I) depositing the first electrode on the substrate, II) coating a solution of n-type and p-type organic semiconductor materials, a compound represented by Formula 1:

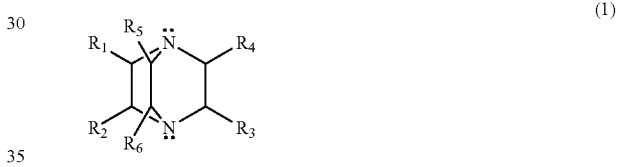

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups, and a first solvent on the first electrode to form the photoactive layer, and III) drying the photoactive layer and depositing the second electrode thereon.

In step I), the first electrode is deposited on the substrate. The deposition may be performed by sputtering or vacuum thermal evaporation.

In step II), a solution of n-type and p-type organic semiconductor materials, the compound represented by Formula 1, and a first solvent is coated on the first electrode to form the photoactive layer.

The first solvent may be selected from the group consisting of methanol, ethanol, propanol, isopropanol, butanol, acetone, benzene, toluene, xylene, diethyl ether, methyl butyl ether, ethyl acetate, tetrahydrofuran (THF), dimethylformamide (DMF), dimethyl sulfoxide (DMSO), N-methylpyrrolidone (NMP), dimethylacetamide (DMAC), dichloromethane, chloroform, carbon tetrachloride, dichloroethane, trichloroethane, tetrachloroethane, chlorobenzene, dichlorobenzene, trichlorobenzene, pentane, hexane, cyclohexane, cyclopentanone, cyclohexanone, dioxane, terpineol, methyl ethyl ketone, and combinations thereof. Preferably, the first solvent is selected from the group consisting of dichloromethane, chloroform, carbon tetrachloride, dichloroethane, trichloroethane, tetrachloroethane, chlorobenzene, dichlorobenzene, trichlorobenzene, and combinations thereof, which do not chemically react with materials for other layers.

The first solvent may further include 1,8-diiodooctane as an additive. Specifically, 1,8-diiodooctane may be present in an amount corresponding to 1 to 10% by volume of the first solvent. The presence of 1,8-diiodooctane in an amount exceeding the upper limit may deteriorate the uniformity and surface roughness of the photoactive layer.

Step II) may be carried out by a solution process selected from the group consisting of spin coating, bar coating, slot die coating, and roll-to-roll processing. Spin coating is performed at at least 600 rpm for at least 30 seconds, which are the most preferred conditions taking into consideration the performance and photoelectric conversion efficiency of the organic solar cell.

In subsequent step III), the photoactive layer is dried and the second electrode is then deposited thereon. The second electrode may be deposited by any suitable process known in the art, preferably physical vapor deposition or chemical vapor deposition.

Another aspect of the present invention relates to an organic solar cell including a substrate, a first electrode and a second electrode opposite each other, a photoactive layer disposed between the first and second electrodes, and an intermediate layer disposed on at least one surface of the photoactive layer wherein the intermediate layer contains a compound represented by Formula 1:

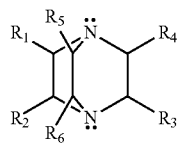

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups.

According to one embodiment, in Formula 1, $R_1$ may be the same as $R_2$, $R_3$ may be the same as $R_4$, and $R_5$ may be the same as $R_6$. This structure is advantageous in terms of ease of synthesis over other structures wherein $R_1$ is different from $R_2$, $R_3$ is different from $R_4$, and $R_5$ is different from $R_6$, and allows the organic solar cell to undergo less deterioration in photoelectric conversion efficiency.

According to a further embodiment, in Formula 1, $R_1$, $R_2$, $R_3$, $R_4$, $R_5$, and $R_6$ may be all hydrogen atoms or the same straight-chain $C_1$-$C_7$ alkyl group. This structure is highly soluble compared to other structures wherein one or more of $R_1$, $R_2$, $R_3$, $R_4$, $R_5$, and $R_6$ are not hydrogen atoms or are functional groups other than the straight-chain $C_1$-$C_7$ alkyl group, and as a result, it is homogenized with the organic semiconductor materials to form the photoactive layer in the form of a thin film, causing no significant loss in initial efficiency and no significant time-dependent changes in photoelectric conversion efficiency.

According to another embodiment, in Formula 1, $R_1$, $R_2$, $R_3$, $R_4$, $R_5$, and $R_6$ may be all hydrogen atoms. Specifically, this structure is represented by Formula 2:

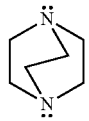

(2)

It was found that the use of an antioxidant or triplet quencher other than the compound represented by Formula 2 fails to improve and even deteriorates the photostability of the organic semiconductor materials. In contrast, the use of the compound represented by Formula 2 is effective in improving the photostability of the organic solar cell while maintaining the efficiency of the organic solar cell at a level equal or similar to its initial efficiency.

The presence of the compound represented by Formula 2 in the intermediate layer enables effective removal of singlet oxygen produced when the photoactive layer reacts with light. Specifically, singlet oxygen produced upon exposure of the organic solar cell device to light and air is converted into triplet oxygen by the compound represented by Formula 2. Thus, the intermediate layer protects the photoactive layer to maintain high efficiency of the organic solar cell for a long time.

The intermediate layer may be between 1 and 60 nm in average thickness. The intermediate layer having an average thickness of less than 1 nm cannot sufficiently prevent the photoactive layer from being deformed by singlet oxygen. Meanwhile, no current may flow through the intermediate layer having an average thickness exceeding 60 nm. Most preferably, the intermediate layer is between 1 and 20 nm in average thickness. If the average thickness of the intermediate layer exceeds 20 nm, the organic solar cell cannot achieve a photoelectric conversion efficiency of 8% or more.

The photoactive layer may further include 1,8-diiodooctane to enhance the photostability of the organic solar cell.

The organic solar cell may further include either a hole transport layer or an electron transport layer or both. Exemplary structures of the organic solar cell are illustrated in FIGS. 15A and 15B.

Figure 15A:
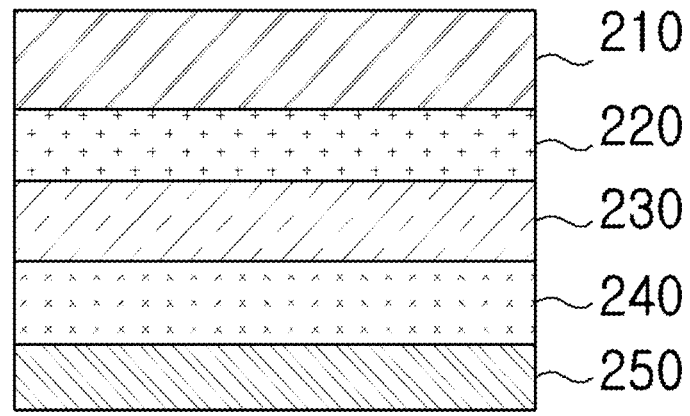
FIGS. 15A and 15B schematically illustrate exemplary structures of an organic solar cell according to a further embodiment of the present invention.
Figure 15B:
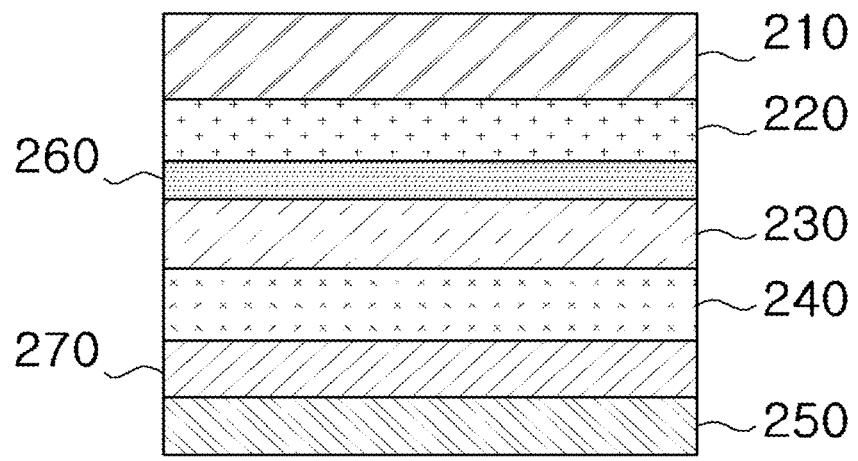

The organic solar cell illustrated in FIGS. 15A and 15B is similar to that illustrated in FIGS. 14A and 14B as a whole but is distinguished from that illustrated in FIGS. 14A and 14B in that the compound represented by Formula 1 is not present in the photoactive layer, and instead, the intermediate layer is disposed on at least one surface of the photoactive layer to improve the photostability of the photoactive layer without deteriorating the photoelectric conversion efficiency and morphology of the photoactive layer.

Repeated explanation of the elements having the same function in the organic solar cells of FIGS. 14A, 14B, 15A and 15B is omitted herein.

According to one embodiment, the intermediate layer is most preferably formed between the electron transport layer and the photoactive layer. This arrangement can prevent the photoelectric conversion efficiency of the organic solar cell device from deteriorating because the morphology of the photoactive layer is less affected when the intermediate layer is formed between the electron transport layer and the photoactive layer than between the photoactive layer and the hole transport layer.

Organic solar cells are generally easy to fabricate and provide high performance at small thicknesses. Despite these disadvantages, semiconductor materials for photoactive layers are likely to be deformed by singlet oxygen produced by light. Thus, encapsulation is necessary to block oxygen. Particularly, exposure to both light and oxygen is liable to deteriorate the performance of organic solar cells, making their long-term use difficult. For this reason, the widespread commercialization of organic solar cells remains limited.

The present inventors were aware of this problem and proposed improved structures of organic solar cells with enhanced photostability in air.

Due to its improved structure, the organic solar cell of the present invention maintains 50 to 80% of its initial photoelectric conversion efficiency when exposed to simulated sunlight (AM 1.5G, 100 mW/cm$^2$) for 15 to 25 hours without the need for encapsulation. In contrast, a conventional organic solar cell device without a stabilizing intermediate layer maintains only 30 to 45% of its initial photoelectric conversion efficiency when exposed to simulated sunlight (AM 1.5G, 100 mW/cm$^2$) for 15 to 25 hours. That is, the photoelectric conversion efficiency of the organic solar cell according to the present invention is maintained at a higher level than that of the conventional organic solar cell.

Yet another aspect of the present invention relates to a method for fabricating the organic solar cell including a substrate, a first electrode and a second electrode opposite each other, a photoactive layer disposed between the first and second electrodes, and an intermediate layer disposed on at least one surface of the photoactive layer, the method including I) depositing the first electrode on the substrate, II) coating a solution of n-type and p-type organic semiconductor materials and a first solvent on the first electrode to form the photoactive layer, III) drying the photoactive layer and depositing the second electrode thereon, and IV) coating a solution including a compound represented by Formula 1:

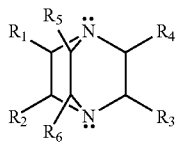

(1)

wherein $R_1$, $R_2$, $R_3$, $R_4$, $R_5$, and $R_6$ are the same as or different from each other and are each independently selected from the group consisting of a hydrogen atom, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups, and a second solvent on the first electrode after step I) and before step II) and/or on the photoactive layer after step II) and before step III) to form the intermediate layer.

In step I), the first electrode is deposited on the substrate. The deposition may be performed by sputtering or vacuum thermal evaporation.

In step II), a solution of n-type and p-type organic semiconductor materials, the compound represented by Formula 1, and a first solvent is coated on the first electrode to form the photoactive layer.

The first solvent may be selected from the group consisting of methanol, ethanol, propanol, isopropanol, butanol, acetone, benzene, toluene, xylene, diethyl ether, methyl butyl ether, ethyl acetate, tetrahydrofuran (THF), dimethylformamide (DMF), dimethyl sulfoxide (DMSO), N-methylpyrrolidone (NMP), dimethylacetamide (DMAC), dichloromethane, chloroform, carbon tetrachloride, dichloroethane, trichloroethane, tetrachloroethane, chlorobenzene, dichlorobenzene, trichlorobenzene, pentane, hexane, cyclohexane, cyclopentanone, cyclohexanone, dioxane, terpineol, methyl ethyl ketone, and combinations thereof. Preferably, the first solvent is selected from the group consisting of dichloromethane, chloroform, carbon tetrachloride, dichloroethane, trichloroethane, tetrachloroethane, chlorobenzene, dichlorobenzene, trichlorobenzene, and combinations thereof, which do not chemically react with materials for other layers.

The first solvent may further include 1,8-diiodooctane as an additive. Specifically, 1,8-diiodooctane may be present in an amount corresponding to 1 to 10% by volume of the first solvent. The presence of 1,8-diiodooctane in an amount exceeding the upper limit may deteriorate the uniformity and surface roughness of the photoactive layer.

Step II) may be carried out by a solution process selected from the group consisting of spin coating, bar coating, slot die coating, and roll-to-roll processing. Spin coating is performed at at least 1000 rpm for at least 30 seconds, which are the most preferred conditions taking into consideration the performance and photoelectric conversion efficiency of the organic solar cell.

In subsequent step III), the photoactive layer is dried and the second electrode is then deposited thereon. The second electrode may be deposited by any suitable process known in the art, preferably physical vapor deposition or chemical vapor deposition.

In step IV), a solution including the compound represented by Formula 1 and a second solvent is coated on the first electrode after step I) and before step II) and/or on the photoactive layer after step II) and before step III) to form the intermediate layer.

The second solvent may be selected from the group consisting of methanol, ethanol, propanol, isopropanol, butanol, acetone, benzene, toluene, xylene, diethyl ether, methyl butyl ether, ethyl acetate, tetrahydrofuran (THF), dimethylformamide (DMF), dimethyl sulfoxide (DMSO), N-methylpyrrolidone (NMP), dimethylacetamide (DMAC), dichloromethane, chloroform, carbon tetrachloride, dichloroethane, trichloroethane, tetrachloroethane, chlorobenzene, dichlorobenzene, trichlorobenzene, pentane, hexane, cyclohexane, cyclopentanone, cyclohexanone, dioxane, terpineol, methyl ethyl ketone, and combinations thereof. Preferably, the second solvent is selected from the group consisting of methanol, ethanol, propanol, isopropanol, hexane, cyclohexane, tetrahydrofuran, ethyl acetate, and combinations thereof, which do not chemically react with materials for the light-absorbing layer and the electron transport layer.

The intermediate layer may be formed by a solution process selected from the group consisting of spin coating, bar coating, slot die coating, and roll-to-roll processing. Preferably, spin coating is performed at at least 1000 rpm for at least 30 seconds.

The present invention will be explained in more detail with reference to the following examples. However, these examples are not to be construed as limiting or restricting the scope and disclosure of the invention. It is to be understood that based on the teachings of the present invention including the following examples, those skilled in the art can readily practice other embodiments of the present invention whose experimental results are not explicitly presented. It will also be understood that such modifications and variations are intended to come within the scope of the appended claims.

Preparative Example 1: Preparation of PTB7 Solution

PTB7 (1 mg) was dissolved in 40 ml of toluene to prepare a 3.3×10$^{-5}$ M PTB7 stock solution. 1 ml of the PTB7 stock solution was mixed with 1 ml of toluene in a pre-cleaned quartz cuvette to prepare a PTB7 solution.

Preparative Example 2: Preparation of PTB7+DABCO (Formula 2) Solution

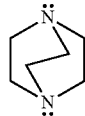

(2)

1,4-Diazabicyclo[2,2,2]octane (DABCO, 11.2 mg) was dissolved in 2 ml of toluene to prepare a $5.0 \times 10^{-2}$ M DABCO stock solution. 1 ml of the DABCO stock solution was mixed with 1 ml of the PTB7 stock solution prepared in Preparative Example 1 in a pre-cleaned quartz cuvette to obtain a PTB7+DABCO solution. The DABCO was purchased from Sigma-Aldrich (D27802).

Example 1: Formation of Photoactive Layer (PTB7:$PC_{71}$BM Thin Film)

A glass substrate was sequentially washed with isopropyl alcohol, acetone, and isopropyl alcohol (each for 10 min) in an ultrasonic washer, dried, and subjected to UV/ozone treatment for 20 min before use.

1 ml of a mixed solvent of chlorobenzene and 1,8-diiodooctane (DIO) (97:3 v/v) was mixed with a mixture of PTB7 (10 mg) and $PC_{71}$BM (15 mg) in a weight ratio of 1:1.5. The resulting mixture was spin coated at 1000 rpm on the pretreated glass substrate to form a PTB7:$PC_{71}$BM thin film.

Example 2: Formation of Photoactive Layer with Improved Photostability (PTB7:$PC_{71}$BM+DABCO Thin Film)

1 ml of a mixed solvent of chlorobenzene and 1,8-diiodooctane (DIO) (97:3 v/v) was mixed with a mixture of PTB7 (10 mg), $PC_{71}$BM (15 mg), and DABCO (10 mg) in a weight ratio of 1:1.5:1. The resulting mixture was spin coated at 1000 rpm on the pretreated glass substrate to form a PTB7:$PC_{71}$BM+DABCO thin film.

Example 3: Fabrication of Organic Solar Cell Using the PTB7:$PC_{71}$BM Thin Film An indium-tin-oxide (ITO) substrate was sequentially washed with isopropyl alcohol, acetone, and isopropyl alcohol (each for 10 min) in an ultrasonic washer, dried, and subjected to UV/ozone treatment for 20 min before use.

1 g of zinc acetate dihydrate and 0.28 g of ethanolamine were dissolved in 10 ml of 2-methoxyethanol, filtered through a 0.45 μm nylon filter, and spin coated at 4000 rpm on the pretreated ITO substrate for 60 sec. The coated substrate was annealed on a hot plate at 200° C. for 20 min. The resulting ITO/ZnO substrate was transferred to a nitrogen-filled glove box. The zinc oxide functions as an electron transport layer.

A mixed solvent of 1 ml of chlorobenzene and 1,8-diiodooctane (DIO, 97:3 v/v) was mixed with a mixture of PTB7 (10 mg) and $PC_{71}$BM (13 mg) in a weight ratio of 1:1.3. The resulting mixture was spin coated at a rate of 1000 rpm on the pretreated ITO/ZnO substrate for 60 sec to form a PTB7:$PC_{71}$BM thin film. A 4.0 nm-thick molybdenum oxide hole transport layer and a 100 nm-thick silver electrode were sequentially deposited on the PTB7:$PC_{71}$BM thin film, completing the fabrication of a solar cell having an ITO/ZnO/PTB7:$PC_{71}$BM/$MoO_3$/Ag structure.

Examples 4-1 to 4-2: Fabrication of Organic Solar Cells Using PTB7:$PC_{71}$BM+DABCO Thin Films 1 ml of a mixed solvent of chlorobenzene and 1,8-diiodooctane (DIO, 97:3 v/v) was mixed with a mixture of PTB7, $PC_{71}$BM, and DABCO in a weight ratio of 1:1.3:0.75 (Example 4-1). The resulting mixture was used to form a PTB7:$PC_{71}$BM+DABCO thin film on an ITO/ZnO substrate. A solar cell having an ITO/ZnO/PTB7:$PC_{71}$BM+DABCO/$MoO_3$/Ag structure was fabricated in the same manner as in Example 3, except that the PTB7:$PC_{71}$BM+DABCO thin film was used instead of the PTB7:$PC_{71}$BM thin film. A solar cell having an ITO/ZnO/PTB7:$PC_{71}$BM+DABCO/$MoO_3$/Ag structure was fabricated in the same manner as in Example 4-1, except that the weight ratio of PTB7, $PC_{71}$BM, and DABCO was changed to 1:1.3:1 (Example 4-2).

The weight ratios of PTB7, $PC_{71}$BM, and DABCO for the production of the PTB7:$PC_{71}$BM+DABCO thin films are specifically shown in Table 1.

TABLE 1

| Example No. | Photoactive layer PTB7 (mg) | $PC_{71}$BM (mg) | DABCO (mg) | Solvent (ml) |
|---|---|---|---|---|
| Example 4-1 (0.75 wt/vol %) | 10 | 13 | 7.5 | 1 |
| Example 4-2 (1.00 wt/vol %) | | | 10 | |

The numbers in the parenthesis indicate the weight percent of DABCO relative to the volume of the solvent (wt/vol %). Specifically, the wt/vol % of DABCO is calculated by {DABCO (wt)/solvent (vol)}×100(%)

Examples 5-1 to 5-5: Fabrication of Organic Solar Cells Using DABCO Thin Films as Intermediate Layers DABCO solutions were prepared in the mixing ratios shown in Table 2. Each of the DABCO solutions was spin coated at a rate of 4000 rpm on an ITO/ZnO thin film for 60 sec to form a DABCO thin film as an intermediate layer. The DABCO thin film was allowed to stand under a nitrogen atmosphere for 10 min. Thereafter, a PTB7:$PC_{71}$BM thin film was formed on the intermediate layer in the same manner as described in Example 3 to fabricate an organic solar cell having an ITO/ZnO/DABCO/PTB7:$PC_{71}$BM/$MoO_3$/Ag structure.

The DABCO solutions were prepared by dissolving different amounts (mg) of DABCO in 1 ml of methanol as a solvent.

TABLE 2

| Example No. | Intermediate layer DABCO (mg) | Solvent (ml) |
|---|---|---|
| Example 5-1 | 1.0 | 1 |

TABLE 2-continued

| Example No. | Intermediate layer DABCO (mg) | Solvent (ml) |
|---|---|---|
| (0.10 wt/vol %) | | |
| Example 5-2 | 2.0 | 1 |
| (0.20 wt/vol %) | | |
| Example 5-3 | 3.0 | 1 |
| (0.30 wt/vol %) | | |
| Example 5-4 | 4.0 | 1 |
| (0.40 wt/vol %) | | |
| Example 5-5 | 5.0 | 1 |
| (0.50 wt/vol %) | | |

Experimental Example 1: Analysis of Photostabilities of the PTB7 Solution and the PTB7+DABCO Solution Depending on the Presence of the Compound Represented by Formula 1

In order to investigate the influence of the addition of the compound represented by Formula 2 on the photostability of PTB7, a polymer for conventional photoactive layers, the photostability of the PTB7 solution prepared in Preparative Example 1 was compared with that of the solution prepared in Preparative Example 2.

Specifically, time-dependent changes in the absorbance of the two solutions were measured by UV/vis spectroscopy after exposure of the solutions to simulated sunlight (AM 1.5G, 100 mW/cm² intensity). The results are shown in FIGS. 1, 2, and 3.

FIG. 1 shows absorption spectra of the PTB7 solution prepared in Preparative Example 1 as a function of exposure time. FIG. 2 shows absorption spectra of the PTB7+DABCO solution prepared in Preparative Example 2 for the formation of a photoactive layer with improved photostability as a function of exposure time.

Figure 3:
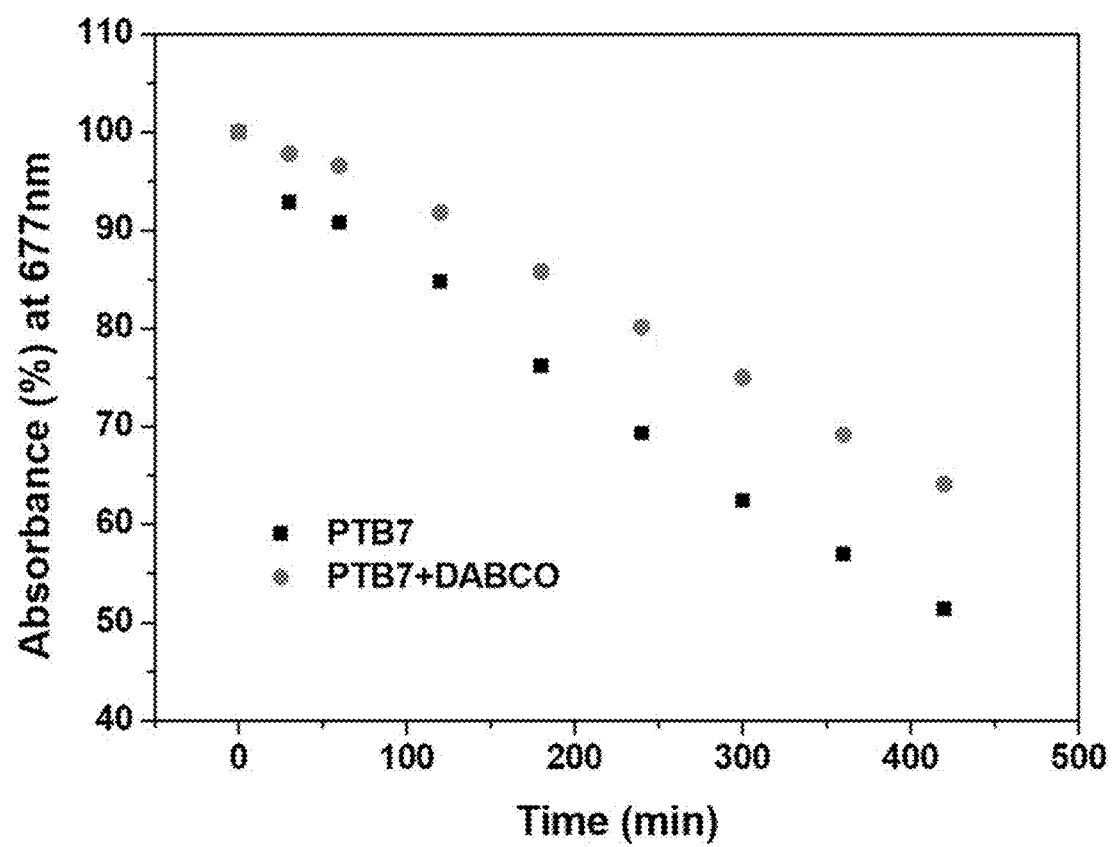
FIG. 3 shows changes in the absorbance of a PTB7 solution prepared in Preparative Example 1 and a PTB7+DABCO solution prepared in Preparative Example 2 at a maximum absorption wavelength (677 nm) as a function of exposure time, which were measured in Experimental Example 1.

FIG. 3 shows changes in the absorbance of the PTB7 solution prepared in Preparative Example 1 and the PTB7+DABCO solution prepared in Preparative Example 2 at a maximum absorption wavelength (677 nm) as a function of exposure time.

Figure 2:
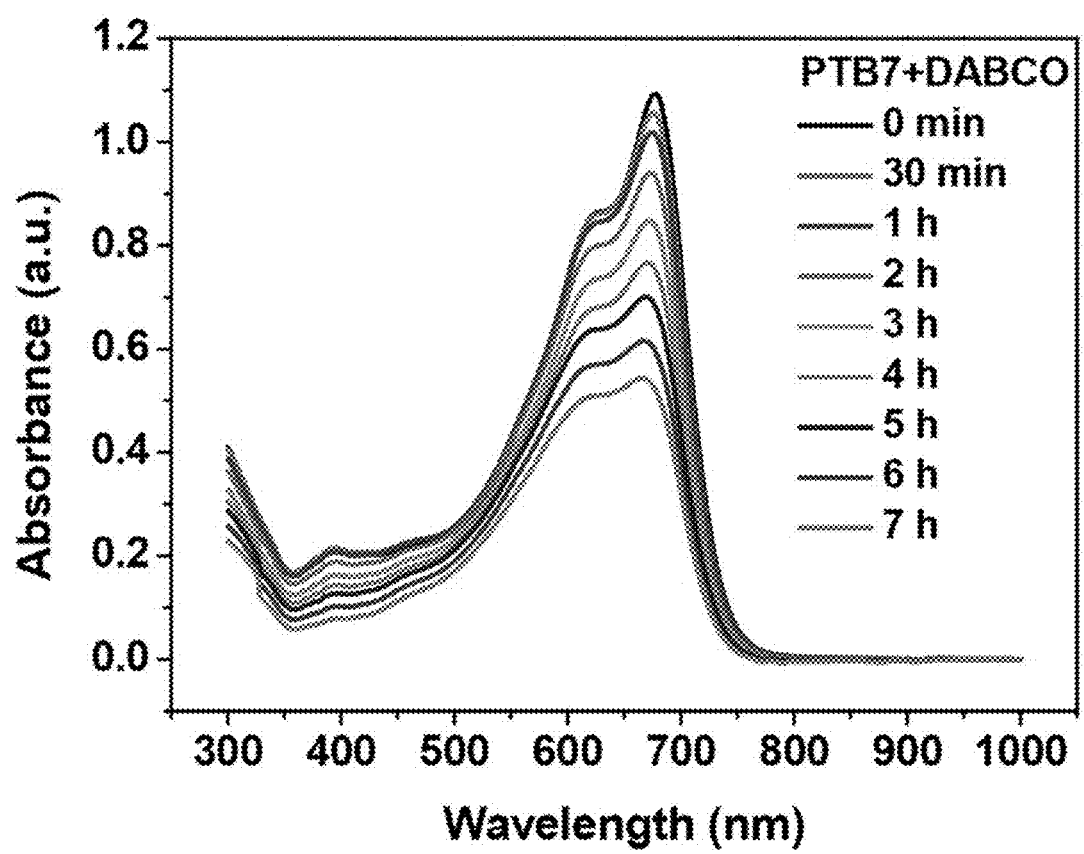
FIG. 2 shows absorption spectra of a PTB7+DABCO solution prepared in Preparative Example 2 for the formation of a photoactive layer with improved photostability as a function of exposure time, which were measured in Experimental Example 1.

Referring to FIGS. 1, 2, and 3, the absorbance of the PTB7 solution (Preparative Example 1) was rapidly reduced to half of its initial value with increasing exposure time. In contrast, the absorbance of the PTB7+DABCO solution (Preparative Example 2) decreased very slowly compared to that of the PTB7 solution with increasing exposure time. From these results, it can be seen that the use of the DABCO represented by Formula 2 considerably increases the photostability of the polymer used for the formation of a photoactive layer. Therefore, it can be concluded that the addition of the compound of Formula 1 contributes to an increase in the photostability (i.e. lifetime) of a photoactive layer.

Experimental Example 2: Analysis of Photostabilities of the Photoactive Layers Depending on the Presence of the Compound Represented by Formula 1

The photostability of the photoactive layer (PTB7:PC$_{71}$BM thin film) produced in Example 1 was compared with that of the photoactive layer (PTB7:PC$_{71}$BM+DABCO thin film) produced in Example 2 to investigate the influence of the addition of the compound represented by Formula 2 on the photostabilities of the photoactive layers.

Specifically, time-dependent changes in the absorbance of the two photoactive layers were measured by UV/vis spectroscopy after exposure of the photoactive layers to simulated sunlight (AM1.5G, 100 mW/cm²). The results are shown in FIGS. 4, 5, and 6.

Figure 4:
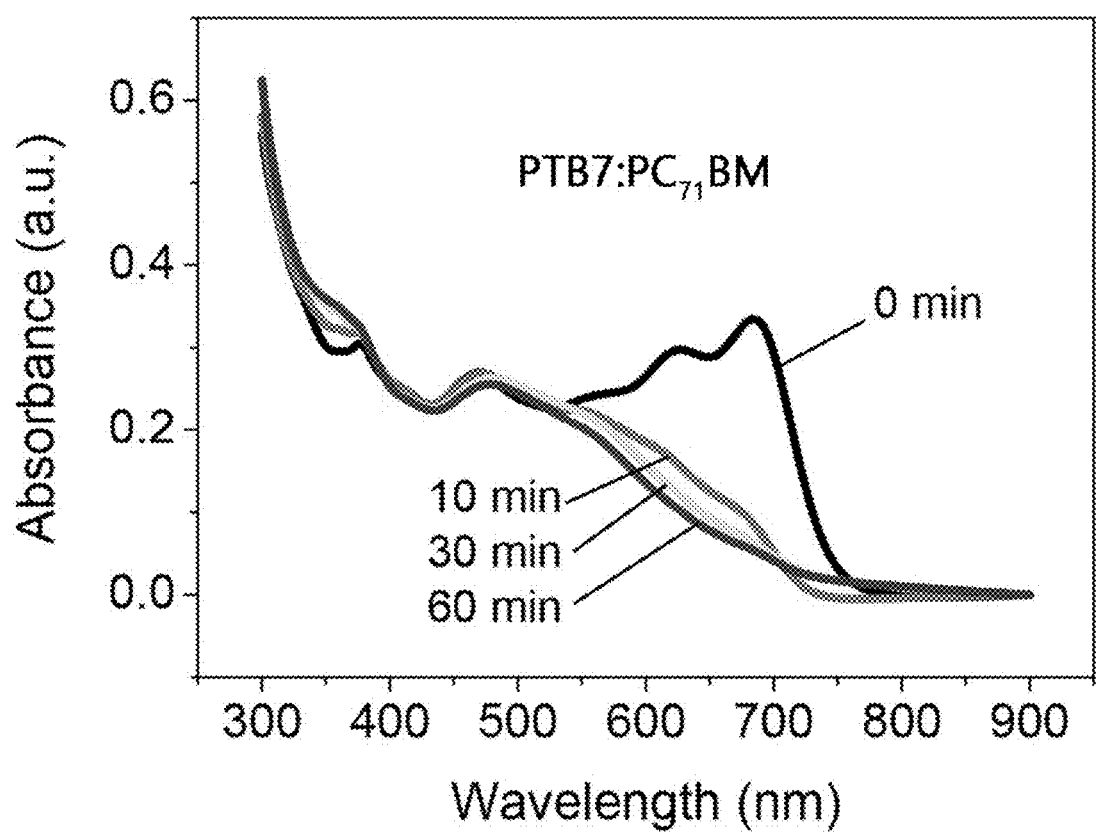
FIG. 4 shows absorption spectra of a PTB7:$PC_{71}BM$ thin film produced as a photoactive layer in Example 1 as a function of exposure time.

FIG. 4 shows absorption spectra of the photoactive layer (PTB7:PC$_{71}$BM thin film) produced in Example 1 as a function of exposure time. FIG. 5 shows absorption spectra of the photoactive layer (PTB7:PC$_{71}$BM+DABCO thin film) produced in Example 2 as a function of exposure time.

Figure 6:
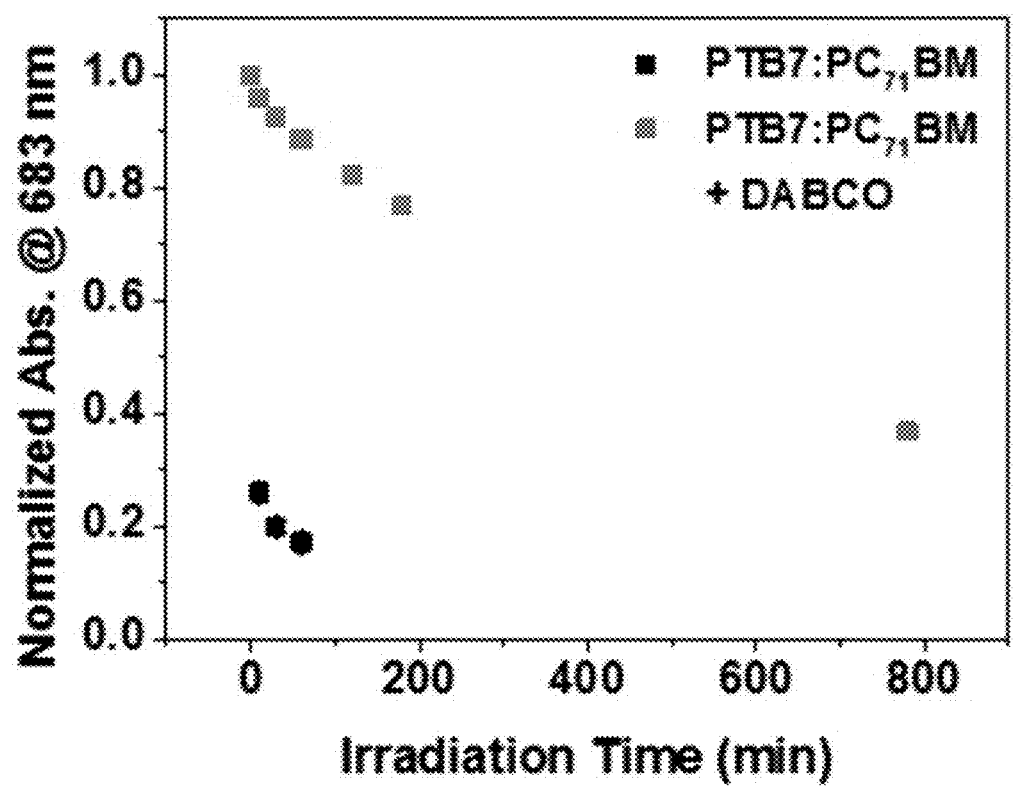
FIG. 6 shows changes in the absorbance of a PTB7:$PC_{71}BM$ thin film produced in Example 1 and a PTB7:$PC_{71}BM$+DABCO thin film produced in Example 2 at a maximum absorption wavelength (683 nm) as a function of exposure time, which were measured in Experimental Example 2.

FIG. 6 shows changes in the absorbance of the PTB7:PC$_{71}$BM thin film produced in Example 1 and the PTB7:PC$_{71}$BM+DABCO thin film produced in Example 2 at a maximum absorption wavelength (683 nm) as a function of exposure time.

Figure 5:
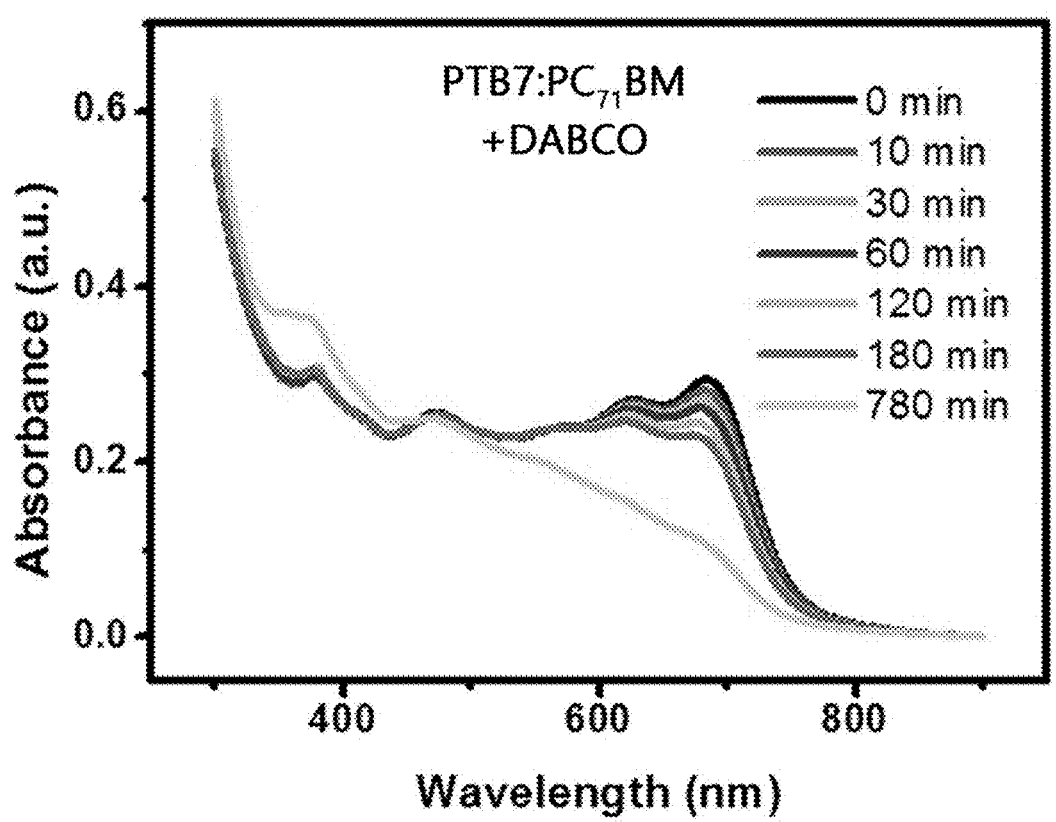
FIG. 5 shows absorption spectra of a PTB7:$PC_{71}BM$+DABCO thin film produced as a photoactive layer in Example 2 as a function of exposure time, which were measured in Experimental Example 2.

Referring to FIGS. 4, 5, and 6, the absorbance of the photoactive layer of Example 1 was rapidly reduced at 500-800 nm corresponding to the absorption wavelengths of the polymer PTB7 with increasing exposure time.

In contrast, the absorbance of the DABCO-containing photoactive layer of Example 2 decreased slowly compared to that of the photoactive layer of Example 1 with increasing exposure time. Therefore, it can be concluded that the addition of the compound of Formula 1 contributes to an increase in the photostability (i.e. lifetime) of the photoactive layer.

Experimental Example 3: Evaluation of Characteristics of the Organic Solar Cells Fabricated in Examples 3, 4-a, and 4-2

The open circuit voltage ($V_{OC}$) and short-circuit current density ($J_{SC}$) values of the organic solar cells fabricated in Examples 3, 4-1, and 4-2 were measured under simulated sunlight with an intensity of 100 mW/cm². The fill factors and energy conversion efficiencies of the organic solar cells were calculated by the following equations 1 and 2:

$$\text{Fill factor} = (V_{mp} \times J_{mp})/(V_{OC} \times J_{SC}) \qquad (1)$$

where $J_{SC}$ is the short-circuit current density and $V_{OC}$ is the open circuit voltage;

$$\text{Energy conversion efficiency (PCE \%)} = \{(\text{fill factor} \times J_{SC} \times V_{OC})/P_{in}\}/100 \qquad (2)$$

where $J_{SC}$ is the short-circuit current density, $V_{OC}$ is the open circuit voltage, and $P_{in}$ (100 mW/cm²) is the power density of incident light.

Figure 7:
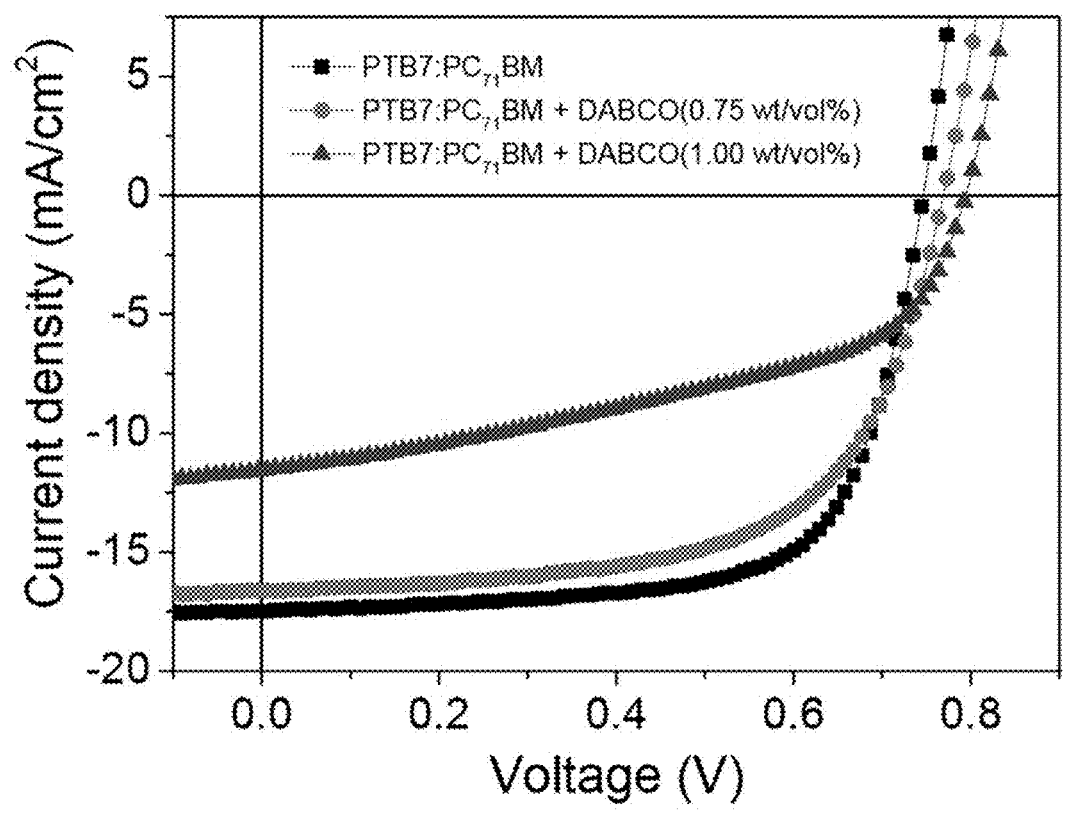
FIG. 7 shows current density-voltage (J-V) curves of organic solar cell devices fabricated in Examples 3, 4-1, and 4-2, which were measured in Experimental Example 3, each of the organic solar cell devices fabricated in Examples 4-1 and 4-2 including a DABCO-containing photoactive layer.

The results are shown in FIG. 7 and Table 3. FIG. 7 shows current density-voltage (J-V) curves of the organic solar cell devices fabricated in Examples 3, 4-1, and 4-2. Each of the organic solar cell devices fabricated in Examples 4-1 and 4-2 included the DABCO-containing photoactive layer.

TABLE 3

| Example No. | $V_{OC}$ [V] | $J_{SC}$ [mA/cm²] | FF [%] | $PCE_{max}$ [%] | $PCE_{avg}$ [%] |
|---|---|---|---|---|---|
| Example 3 | 0.746 | 17.48 | 68.77 | 8.96 | 8.63 ± 0.21 |
| Example 4-1 | 0.769 | 16.61 | 62.05 | 7.93 | 8.00 ± 0.15 |
| Example 4-2 | 0.794 | 11.55 | 47.39 | 4.35 | 4.34 ± 0.09 |

As shown in FIG. 7 and Table 3, the organic solar cell including the PTB7:PC$_{71}$BM photoactive layer (Example 3) showed an average photoelectric conversion efficiency of 8.63%. In contrast, the average photoelectric conversion efficiencies of the organic solar cells including the photoactive layers containing different amounts of DABCO were reduced to 8.00% (Example 4-1) and 4.34% (Example 4-2), respectively.

It is believed that the lower average photoelectric conversion efficiencies of the organic solar cells fabricated in Examples 4-1 and 4-2 were induced from the reduced short-circuit current density ($J_{SC}$) and fill factor (FF) values by the presence of DABCO in the photoactive layers that limits the number of charge transfer pathways in the photoactive layers or affects the morphology of the photoactive layers.

That is, the presence of DABCO in the photoactive layer led to the lower energy conversion efficiency of the organic solar cell of Example 4-1 in terms of initial photoelectric conversion efficiency but contributed to an improvement in the photostability of the polymer PTB7 as a p-type organic semiconductor material of the photoactive layer, leading to an increase in lifetime.

Generally, the photoelectric conversion efficiency of an organic solar cell is affected not only by the photostability of an organic semiconductor material of a photoactive layer but also by the morphology of the photoactive layer for smooth transfer of charges in the photoactive layer. For these reasons, the organic solar cells of Examples 5-1 to 5-4, each including the DABCO intermediate layer formed on one surface of the photoactive layer, can maintain their more stable morphologies for a longer time than the organic solar cell of Example 4-1 including the DABCO-containing photoactive layer. That is, the presence of DABCO in the photoactive layer increases the lifetime of the photoactive layer but even can cause a rapid change in the charge transfer pathway of the photoactive layer (depending on the morphological change).

When the photoelectric conversion efficiencies (including initial photoelectric conversion efficiencies) of the organic solar cells as a function of exposure time were compared in terms of stability, the organic solar cells of Examples 5-1 to 5-4, each including the DABCO intermediate layer formed on one surface of the photoactive layer, showed at least 3 times higher photostabilities, i.e. better life characteristics, than the organic solar cell of Example 4-1 including the DABCO-containing photoactive layer. Particularly, the formation of the DABCO-containing intermediate layer on one surface of the photoactive layer in each of the organic solar cells of Examples 5-1 to 5-4 contributed to an improvement in photostability without negatively affecting the photoelectric conversion efficiency of the organic solar cell.

Figure 8:
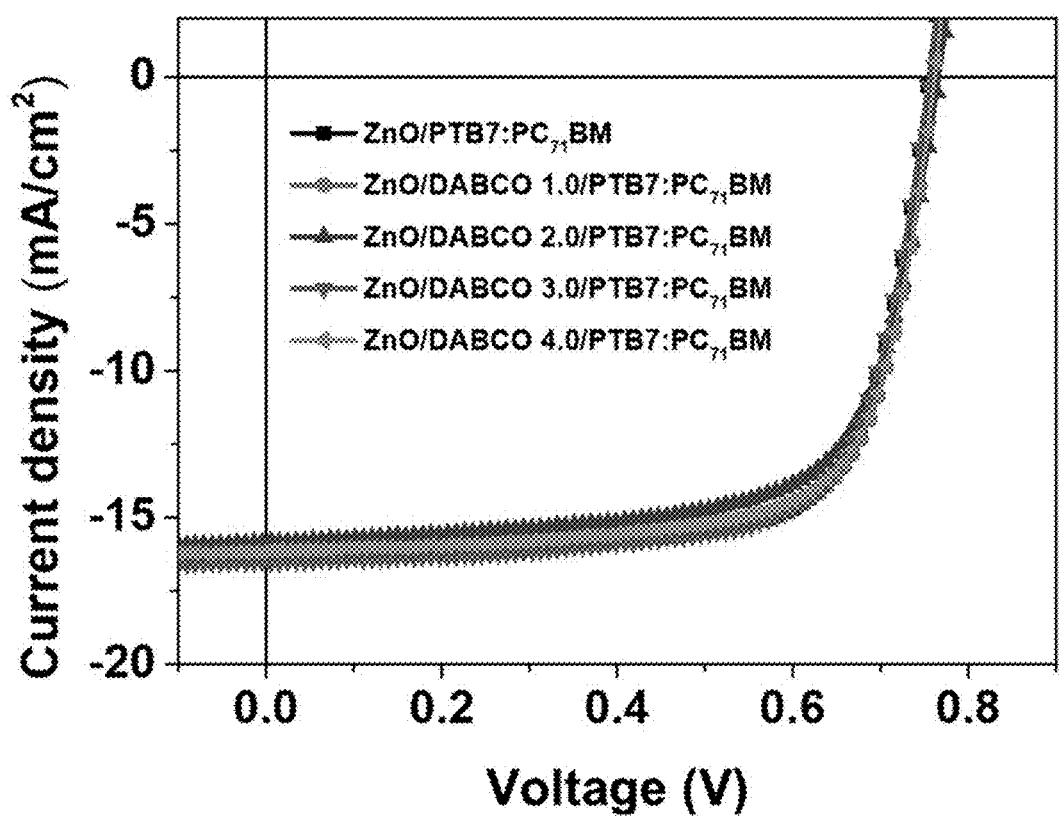
FIG. 8 shows current density-voltage (J-V) curves of organic solar cell devices fabricated in Examples 5-1 to 5-4, which were measured in Experimental Example 4, each of the organic solar cell devices including a DABCO intermediate layer disposed between an electron transport layer and a photoactive layer.

Experimental Example 4: Analysis of Performances of the PTB7:PC$_{71}$BM Organic Solar Cells Including the DABCO Intermediate Layer The open circuit voltage ($V_{OC}$) and short-circuit current density ($J_{SC}$) values of the organic solar cells fabricated in Examples 3 and 5-1 to 5-4 were measured under simulated sunlight with an intensity of 100 mW/cm$^2$. The fill factors and energy conversion efficiencies of the organic solar cells were calculated by Equations 1 and 2. The results are summarized in FIG. 8 and Table 4. FIG. 8 shows current density-voltage (J-V) curves of the organic solar cell devices fabricated in Examples 5-1 to 5-4, each including the DABCO intermediate layer disposed between the electron transport layer and the photoactive layer.

TABLE 4

| Example No. | $V_{OC}$ [V] | $J_{SC}$ [mA/cm$^2$] | FF [%] | PCE$_{max}$ [%] | PCE$_{avg}$ [%] |
|---|---|---|---|---|---|
| Example 3 | 0.755 | 16.39 | 71.77 | 8.88 | 8.79 ± 0.07 |
| Example 5-1 | 0.760 | 16.24 | 72.22 | 8.92 | 8.75 ± 0.10 |
| Example 5-2 | 0.766 | 15.85 | 69.12 | 8.39 | 8.17 ± 0.20 |
| Example 5-3 | 0.755 | 16.51 | 71.21 | 8.88 | 8.64 ± 0.24 |
| Example 5-4 | 0.761 | 16.17 | 71.41 | 8.79 | 8.67 ± 0.07 |

As shown in FIG. 8 and Table 4, the organic solar cell of Example 3 showed an average photoelectric conversion efficiency of 8.79% and the organic solar cells of Examples 5-1 to 5-4, each including the DABCO intermediate layer, showed average photoelectric conversion efficiencies of 8.75%, 8.17%, 8.64%, and 8.67%, respectively. That is, the initial efficiencies of the organic solar cells of Examples 5-1 to 5-4 were similar to that of the organic solar cell of Example 3.

Experimental Example 5: Analysis of Photostabilities of the PTB7:PC$_{71}$BM Organic Solar Cells Including the DABCO Intermediate Layer The open circuit voltage ($V_{OC}$) and short-circuit current density ($J_{SC}$) values of the organic solar cells fabricated in Examples 3 and 5-1 to 5-4 were measured under simulated sunlight with an intensity of 100 mW/cm$^2$. The fill factors and energy conversion efficiencies of the organic solar cells were calculated by Equations 1 and 2. The results are summarized in FIGS. 9 to 12.

Figure 9:
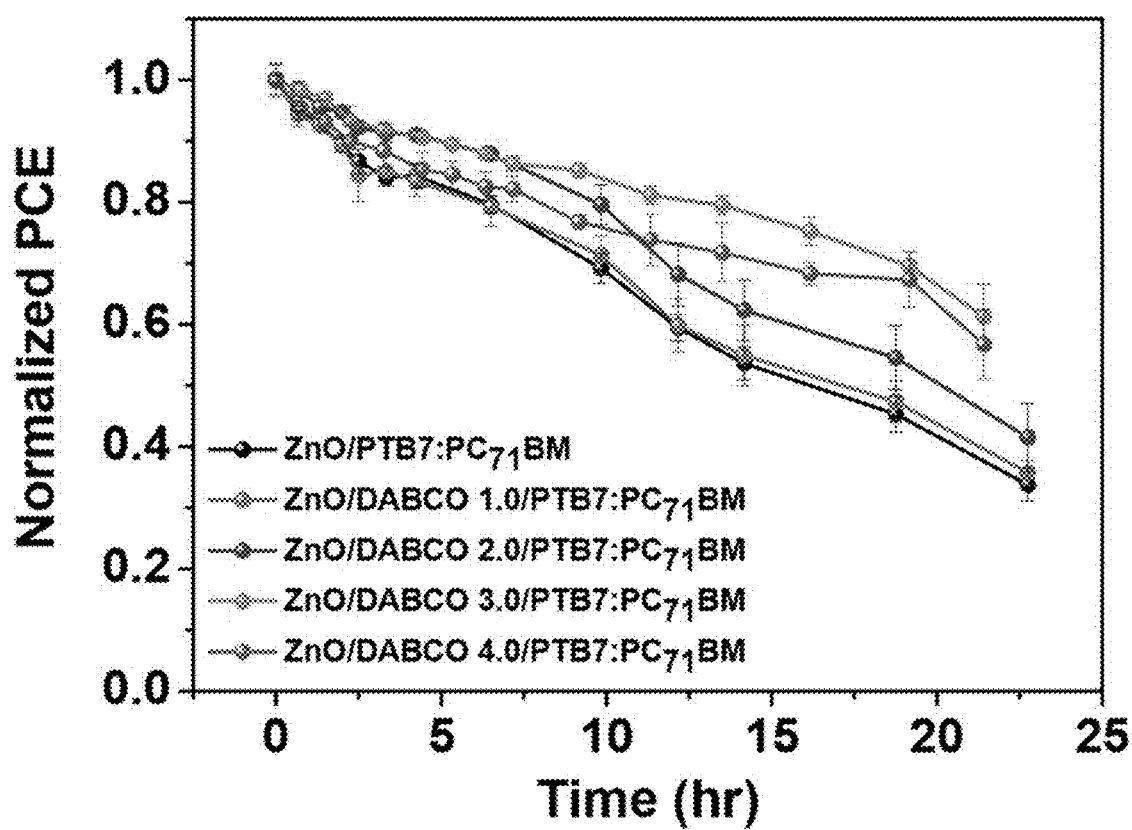
FIG. 9 shows photoelectric conversion efficiencies (PCEs) of organic solar cells fabricated in Examples 5-1 to 5-4 as a function of exposure time, which were measured in Experimental Example 5, each of the organic solar cells including a DABCO intermediate layer disposed between an electron transport layer and a photoactive layer.

FIG. 9 shows photoelectric conversion efficiencies (PCEs) of the organic solar cells fabricated in Examples 5-1 to 5-4 as a function of exposure time, each including the DABCO intermediate layer disposed between the electron transport layer and the photoactive layer.

Figure 10:
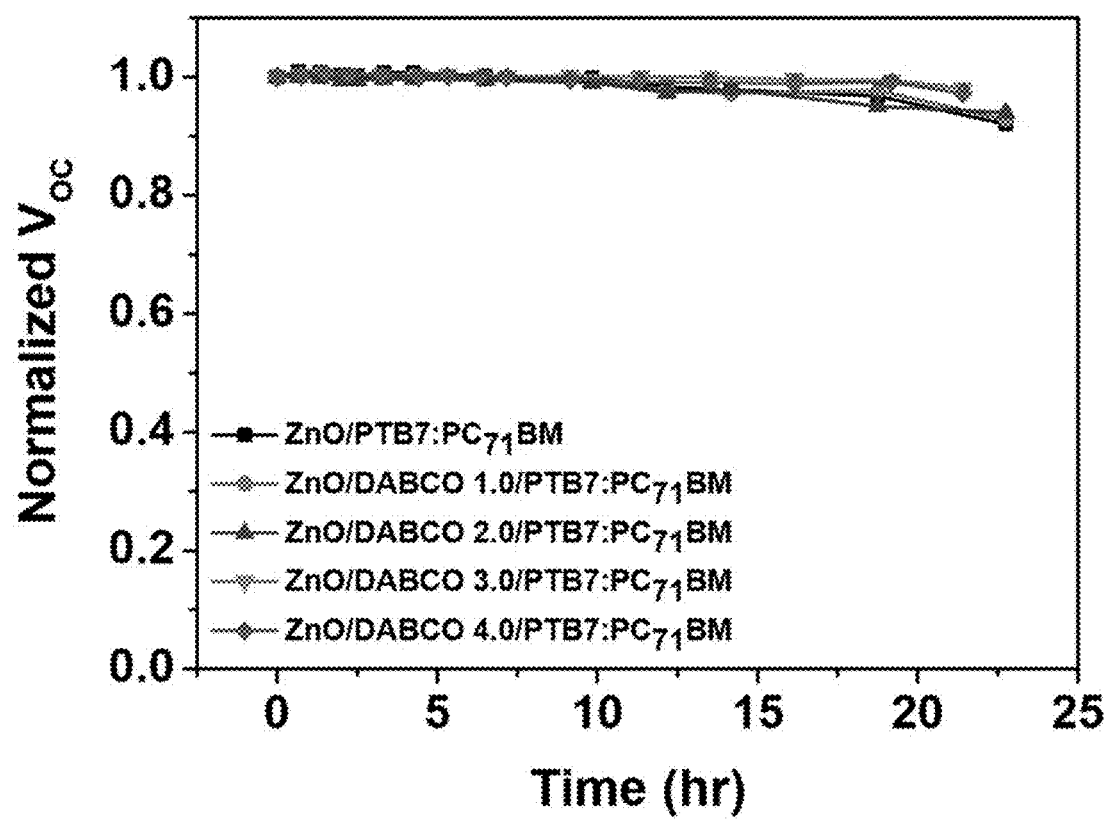
FIG. 10 shows changes in the open circuit voltage ($V_{OC}$) of organic solar cell devices fabricated in Examples 5-1 to 5-4 as a function of exposure time, which were measured in Experimental Example 5, each of the organic solar cell devices including a DABCO intermediate layer disposed between an electron transport layer and a photoactive layer.

FIG. 10 shows changes in the open circuit voltage ($V_{OC}$) of the organic solar cell devices fabricated in Examples 5-1 to 5-4 as a function of exposure time, each including the DABCO intermediate layer disposed between the electron transport layer and the photoactive layer.

Figure 11:
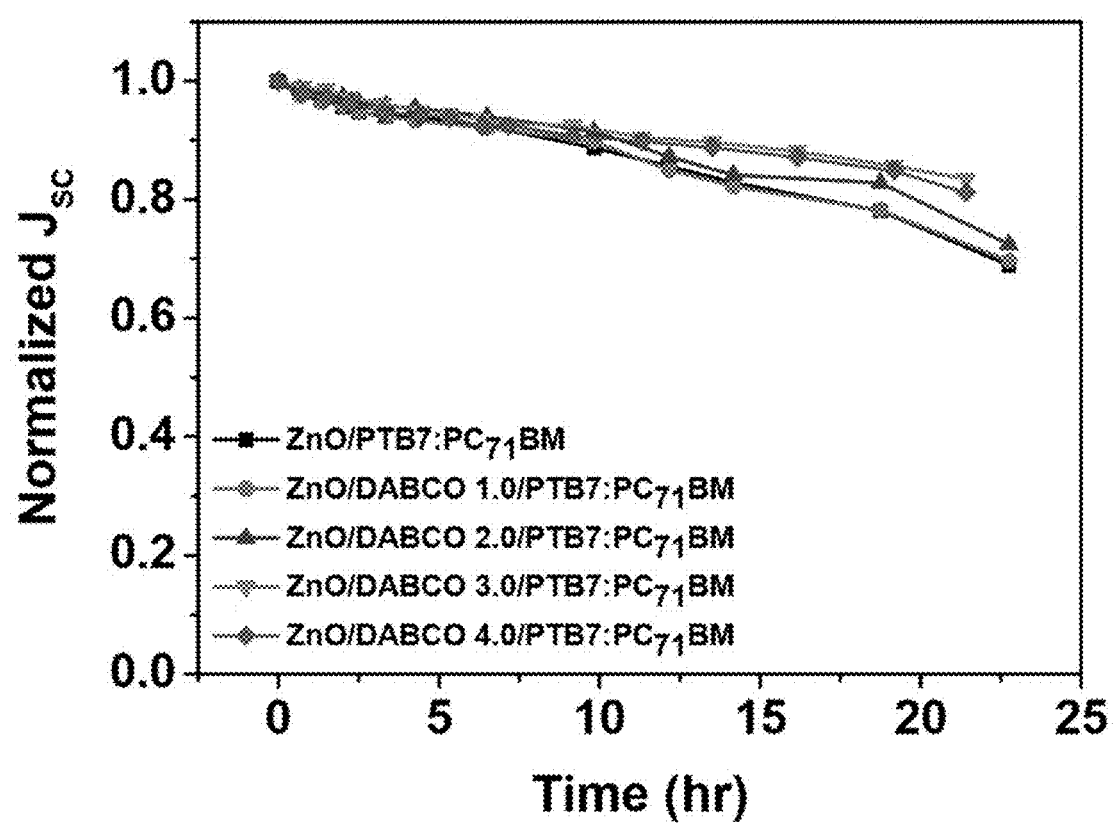
FIG. 11 shows changes in the short-circuit current density ($J_{SC}$) of organic solar cell devices fabricated in Examples 5-1 to 5-4 as a function of exposure time, which were measured in Experimental Example 5, each of the organic solar cell devices including a DABCO intermediate layer disposed between an electron transport layer and a photoactive layer.

FIG. 11 shows changes in the short-circuit current density ($J_{SC}$) of the organic solar cell devices fabricated in Examples 5-1 to 5-4 as a function of exposure time, each including the DABCO intermediate layer disposed between the electron transport layer and the photoactive layer.

Figure 12:
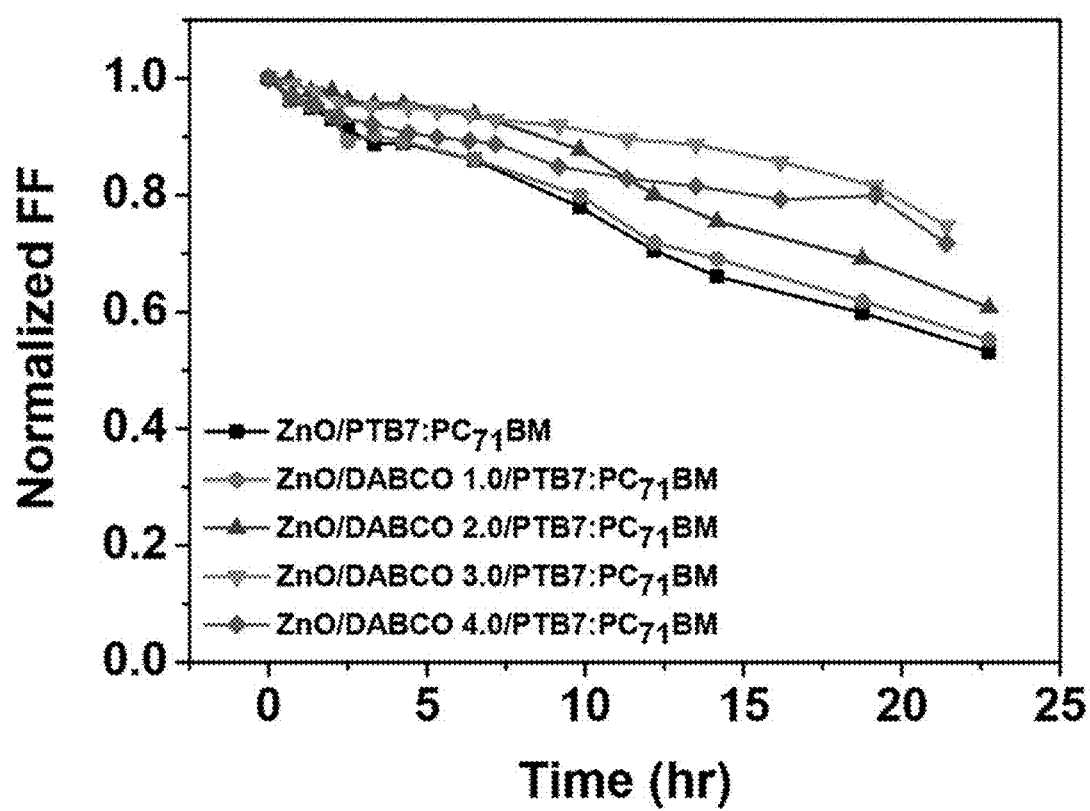
FIG. 12 shows changes in the fill factor (FF) of organic solar cell devices fabricated in Examples 5-1 to 5-4 as a function of exposure time, which were measured in Experimental Example 5, each of the organic solar cell devices including a DABCO intermediate layer disposed between an electron transport layer and a photoactive layer.

FIG. 12 shows changes in the fill factor (FF) of the organic solar cell devices fabricated in Examples 5-1 to 5-4 as a function of exposure time, each including the DABCO intermediate layer disposed between the electron transport layer and the photoactive layer.

Referring to FIGS. 9, 10, 11, and 12, the short-circuit current density ($J_{SC}$) and fill factor (FF) of the organic solar cell fabricated in Example 3 decreased rapidly with increasing exposure time, resulting in a rapid reduction in the photoelectric conversion efficiency (PCE) of the organic solar cell with time. In contrast, the performances (including short-circuit current density ($J_{SC}$) and fill factor (FF) values) of the organic solar cells fabricated in Examples 5-1 to 5-4, each including the DABCO intermediate layer, decreased very slowly compared to those of the organic solar cell of Example 3.

These results lead to the conclusion that DABCO is suitable for use as a stability improver of organic solar cells. Particularly, it was found that the use of DABCO in an intermediate layer rather than in a photoactive layer is effective in improving the photostability of the photoactive layer without loss of initial efficiency.

Experimental Example 6: Analysis of Photostabilities of Solutions Containing Different Additives for the Formation of Photoactive Layers PTB7 as a conventional n-type organic semiconductor material for a photoactive layer was mixed with different additives, including the compound represented by Formula 2, to prepare the following solutions for the formation of photoactive layers.

PTB7 (no add): Preparative Example 1

+DABCO: Preparative Example 2

+NTMS: A solution prepared in the same manner as in Preparative Example 2, except that (3,4-dihydro-1-naphthyloxy)trimethylsilane (NTMS, 540390, Sigma-Aldrich) was used instead of 1,4-diazabicyclo[2,2,2]octane (DABCO, 11.2 mg).

+BHT: A solution prepared in the same manner as in Preparative Example 2, except that 2,6-di-tert-butyl-4-methylphenol (BHT, B1378; Sigma-Aldrich) was used instead of 1,4-diazabicyclo[2,2,2]octane) (DABCO, 11.2 mg).

+TS: A solution prepared in the same manner as in Preparative Example 2, except that trans-stilbene (TS; 139939; Sigma-Aldrich) was used instead of 1,4-diazabicyclo[2,2,2]octane (DABCO, 11.2 mg).

The photostabilities of the solutions were compared.

Specifically, after the solutions were exposed to simulated sunlight (AM 1.5G, 100 mW/cm$^2$), time-dependent changes in the absorbance of the solutions were measured by UV/vis spectroscopy. The results are shown in FIG. 13.

Figure 13:
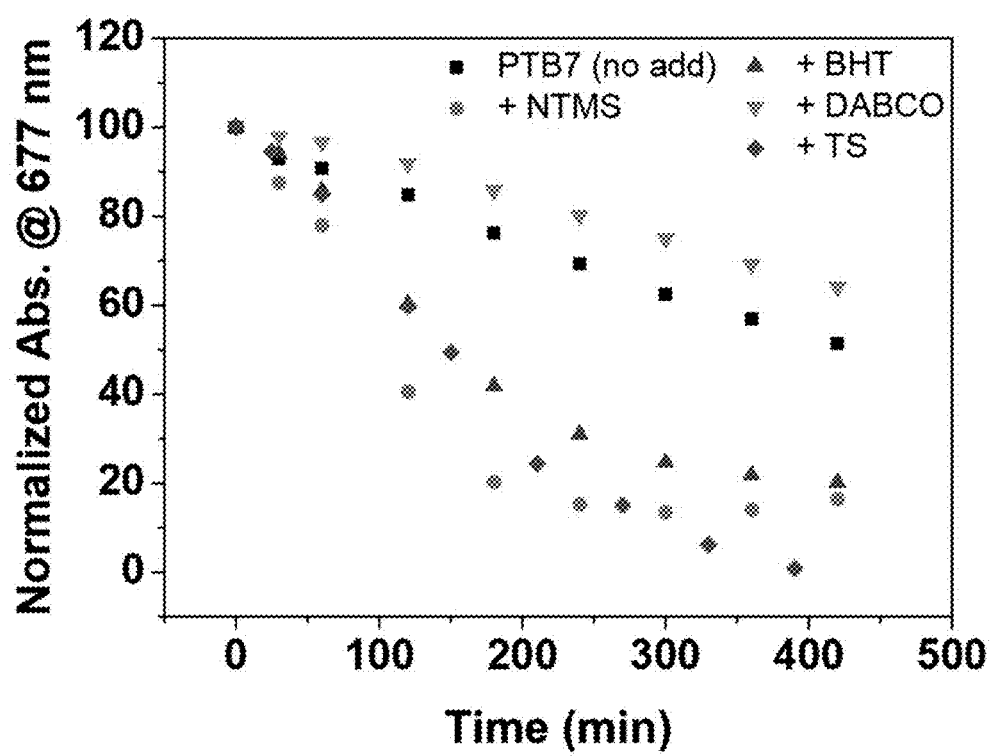
FIG. 13 shows changes in the absorbance of a PTB7 solution (Preparative Example 1), +DABCO (Preparative Example 2), +NTMS, +BHT, and +TS at a maximum absorption wavelength (677 nm) as a function of exposure time, which were measured in Experimental Example 6.

FIG. 13 shows changes in the absorbance of the PTB7 solution (Preparative Example 1), +DABCO (Preparative Example 2), +NTMS, +BHT, and +TS at a maximum absorption wavelength (677 nm) as a function of exposure time.

Referring to FIG. 13, the absorbance of the PTB7 solution (Preparative Example 1) was reduced rapidly to below half of its initial value with increasing exposure time.

In contrast, the absorbance of the DABCO solution (Preparative Example 2) decreased very slowly compared to that of the PTB7 solution with increasing exposure time. These results demonstrate that the use of DABCO represented by Formula 2 considerably increases the photostability of the polymer used for the formation of a photoactive layer. The use of the other additives was found to deteriorate the photostability of the polymer.

What is claimed is:

1. An organic solar cell, comprising:
   a substrate,
   a first electrode;
   a second electrode disposed opposite the first electrode;
   a photoactive layer that is disposed between the first electrode and the second electrode, and that comprises n-type organic semiconductor material and p-type organic semiconductor material; and
   an intermediate layer that is disposed on at least one surface of the photoactive layer and that contains a compound represented by Formula 1 below:

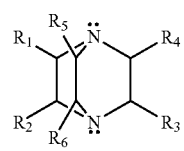

(1)

where $R_1$, $R_2$, $R_3$, $R_4$, $R_5$, and $R_6$ are each independently selected from the group consisting of hydrogen atoms, a carbonyl group, a hydroxyl group, a nitro group, an amino group, a sulfonyl group, a phosphoryl group, straight-chain or branched $C_1$-$C_7$ alkyl groups, and straight-chain or branched $C_8$-$C_{20}$ alkyl groups, wherein $R_1$, $R_2$, $R_3$, $R_4$, $R_5$, and $R_6$ are not all the same.

2. The organic solar cell according to claim 1, wherein, in Formula 1, $R_1$ is the same as $R_2$, $R_3$ is the same as $R_4$, and $R_5$ is the same as $R_6$.

3. The organic solar cell according to claim 1, wherein, in Formula 1, one or more of $R_1$, $R_2$, $R_3$, $R_4$, $R_5$, and $R_6$, but not all are hydrogen atoms or the same straight-chain $C_1$-$C_7$ alkyl group.

4. The organic solar cell according to claim 1, wherein the intermediate layer has a thickness of 1 to 20 nm.

5. The organic solar cell according to claim 1, wherein the photoactive layer further comprises 1,8-diiodooctane.

6. The organic solar cell according to claim 1, further comprising either a hole transport layer or an electron transport layer or both.

* * * * *